United States Patent [19]
Haywood et al.

[11] Patent Number: 6,006,306
[45] Date of Patent: Dec. 21, 1999

[54] INTEGRATED CIRCUIT WITH STAGE-IMPLEMENTED CONTENT-ADDRESSABLE MEMORY CELL

[75] Inventors: Christopher Haywood, Thousand Oaks; Michael de la Garrigue, Agoura Hills, both of Calif.

[73] Assignee: Xylan Corporation, Calabasas, Calif.

[21] Appl. No.: 08/887,359

[22] Filed: Jul. 2, 1997

[51] Int. Cl.[6] .................................................. G11C 15/00

[52] U.S. Cl. ............................................. 711/108; 365/49

[58] Field of Search .............................. 711/108; 365/49

[56] References Cited

U.S. PATENT DOCUMENTS

| | | | |
|---|---|---|---|
| 4,958,377 | 9/1990 | Takahashi | 365/49 |
| 4,959,811 | 9/1990 | Szczepanek | 365/49 |

*Primary Examiner*—Jack A. Lane
*Attorney, Agent, or Firm*—Scot A. Reader

[57] ABSTRACT

A CAM integrated circuit has a stage-implemented CAM cell which operationally separates CAM read operations into distinct stages, including look-up, prioritization and encoding, that execute independently. The staged implementation is achieved by placing registers between operational logic blocks in the CAM cell. The integrated circuit prioritizes inputs received simultaneously on dual input buses to avoid contention.

20 Claims, 5 Drawing Sheets

Figure 7

| LOAD 1 | LOAD 2 | LOAD 3 | REGISTER | LOOK-UP | PRIORITIZE | ENCODE | REGISTER | RAM READ | RESULT |
|---|---|---|---|---|---|---|---|---|---|
| NP-INIT = 1<br>NP-DATA = MSB | NP-INIT = 0<br>NP-DATA = MID | NP-DATA = LSB | | C-COMP = 1 | C-COMP = 0 | C-MATCH = VALID | C-MATCH = INVALID<br>C-INDEX = VALID | | PRIORITY = VALID<br>NP-DATA = VALID |

| LOAD 1 | LOAD 2 | LOAD 3 | LOOK-UP | PRIORITIZE | ENCODE | REGISTER | RAM READ | RESULT |
|---|---|---|---|---|---|---|---|---|
| P-INIT = 1<br>P-DATAIN = MSB | P-INIT = 0<br>P-DATAIN = MID | P-DATAIN = LSB | C-COMP = 1 | C-COMP = 0 | C-MATCH = VALID | C-MATCH = INVALID<br>C-INDEX = VALID | | PRIORITY = VALID<br>P-DATAOUT = VALID |

801, 802, 803, 804, 805, 806, 807, 808, 809

INTEGRATED CIRCUIT WITH STAGE-IMPLEMENTED CONTENT-ADDRESSABLE MEMORY CELL

FIELD OF THE INVENTION

The present invention relates to content-addressable memory (CAM) cells and application-specific integrated circuits (ASICs) in which CAM cells are implemented.

BACKGROUND OF THE INVENTION

In their most basic feature, CAM cells perform associative comparisons on data Associative comparisons are conducted by sending data units to a CAM cell and comparing them for matches with data entries stored in memory locations in a CAM array within the CAM cell. The CAM cell then returns indices associated with matching memory locations.

CAM cells have become increasingly important with the popularization of network computing. Since CAM cells operate independent of processors, CAM cells can be advantageously implemented to enable forwarding and filtering decisions to be made on data packets at near wire-speed. The overall latency of communication in data communication networks is thereby substantially reduced.

Although known CAM cells have advantageously reduced data transfer delay in data communication networks, their performance has yet to be optimized. Such CAM cells have suffered from long access times due to the number of operations they perform. A typical CAM cell "read" operation has three distinct component parts: look-up, prioritization and encoding. In conventional CAM cells, contention has been avoided within the CAM cell by waiting for all three component parts to be completed on a particular data unit before the next-in-line data unit is treated. This "one at a time" configuration has limited the throughput of such CAM cells, resulting in undesirable delays in data transfer and even potential loss of data due to sustained collisions or contention of data packets awaiting access to the CAM cell resources.

A further problem associated with known CAM cells has been the absence of schemes to successfully regulate access to the CAM cell in a dual input bus environment. It is often efficient in LAN computing to have multiple nodes share a single CAM cell. When a CAM cell is shared, there is a need for CAM ASIC designs which successfully regulate access to the CAM cell in order to prevent sustained collisions, contention and possible packet loss.

Accordingly, a significant need has arisen in today's high performance data communication networks for CAM cells with greater throughput. A need has also developed for a dual input bus CAM ASIC design which efficiently regulates access to an associated CAM cell.

SUMMARY OF THE INVENTION

In one aspect, the present invention provides a CAM cell which segments CAM cell read operations into distinct stages that execute independently. The staged implementation is made possible by placing a memory element, such as a register, operatively between each serial pair of operational logic blocks. Such a configuration allows data units to be stored after completing each stage so that subsequent data units can be treated without waiting for the original data units to clear the CAM cell. Therefore, a look-up operation can proceed on one data unit while prioritization, encoding and other desired CAM cell operations can be performed simultaneously on other data units. This stage-implemented approach to CAM cell read operations advantageously reduces the access time of the CAM cell by up to n times as compared to a comparable conventional CAM cell, where n is the number of stages. Overall throughput is therefore substantially improved.

In another aspect, the present invention provides a CAM ASIC which advantageously accepts data units simultaneously on two input buses without contention. The buses are prioritized so that if data units are received on both buses simultaneously, the CAM cell operations proceed on the data unit received on the priority bus while the data unit received on the non-priority bus is delayed by one clock. The delay is preferably achieved by storing the non-priority data unit in a memory element, such as a register.

These and other aspects of the invention can be understood by reference to the following detailed description, taken in conjunction with the accompanying drawings which are briefly described below. Of course, the actual scope of the invention is defined by the appended claims.

BRIEF DESCRIPTION OF THE DRAWINGS

FIG. 7 is an input-output flow timing diagram for the CAM ASIC according to FIG. 2 for a data unit received on the non-priority input bus, where a data unit is received simultaneously on the priority input bus; and FIG. 8 is an input-output flow timing diagram for the CAM ASIC according to FIG. 2 for a data unit received on the priority input bus.

DETAILED DESCRIPTION OF THE PREFERRED EMBODIMENT

Figure 1:
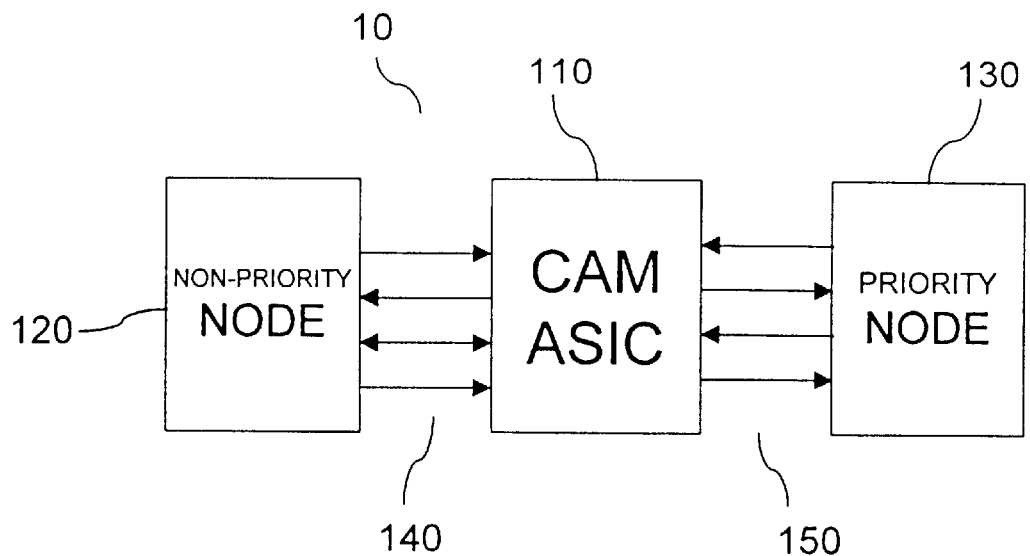
FIG. 1 is a block diagram of a CAM system operating in accordance with a preferred embodiment of the present invention.

Referring to FIG. 1, a CAM system 10 operating in accordance with the present invention is shown. CAM system 10 includes a CAM ASIC 110, non-priority node 120 and priority node 130. Nodes 120, 130 may be processors, controllers, or other hardware or software-implemented devices for performing various data processing or data transfer tasks within a data communication network. Nodes 120, 130 interoperate with ASIC 110 using pins 140, 150 to communicate concerning CAM read operations. CAM read operations include operations in which data units are compared for matches with data entries stored in a CAM in ASIC 110 and responses are returned. CAM read operations may also include other operations, such as prioritization and encoding. Node 120 also interoperates with ASIC 110 using pins 140 to communicate concerning CAM write operations. Write operations include operations in which data is added to or is caused to be deleted from a CAM in ASIC 110. Nodes 120, 130 are configured to have different priority of access to ASIC 110 for purposes of read operations.

Particularly, read operations on data units from non-priority node 120 are postponed if data for a CAM read is simultaneously received from priority node 130, as will be described in greater detail It will be appreciated that FIG. 1 illustrates only one of numerous possible CAM system configurations for a CAM ASIC having a stage-implemented CAM cell.

Figure 2:
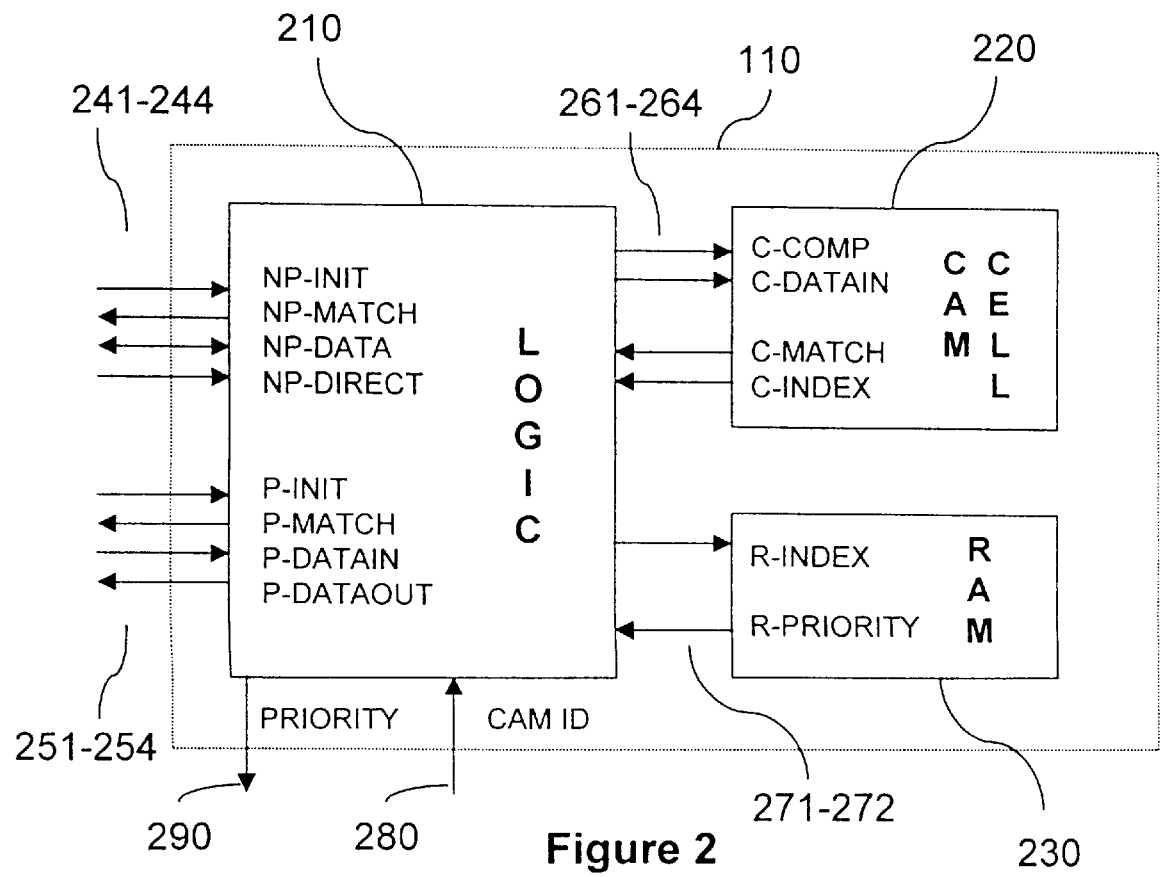
FIG. 2 is a block diagram of the CAM ASIC component of the CAM system according to FIG. 1.

Referring to FIG. 2, CAM ASIC 110 is illustrated in greater detail. ASIC 110 includes control logic cell 210, stage-implemented CAM cell 220 and random access memory (RAM) 230. Logic cell 210 conducts and regulates data flows between CAM cell 220, RAM 230 and nodes 120, 130. Logic cell 210 is associated with pins 241 through 244 operative between cell 210 and non-priority node 120, pins 251 through 254 operative between cell 210 and priority node 130, pins 261 through 264 operative between cell 210 and CAM cell 220 and pins 271 and 272 operative between cell 210 and RAM cell 230. Logic cell 210 is also associated with CAM ID pin 280 and PRIORITY pin 290. CAM ID pin 280 and PRIORITY pin 290 are operative between cell 210 and external circuitry. The external circuitry with which PRIORITY pin 290 is operative may be associated with one or both of nodes 120, 130.

Non-priority pins include NP-INIT 241, NP-MATCH 242 and NP-DATA 243 and NP-DIRECT 244. NP-INIT 241 indicates whether on the current clock ASIC 110 will begin to receive data from non-priority node 120 for a new data unit. A new data unit is preferably indicated by changing the value of NP-INIT 241 from its value on the preceding clock. This may be accomplished by pulsing NP-INIT 241 high or low on the clock when the first data for the new data unit is received. NP-MATCH 242 indicates whether or not a CAM look-up operation completed on a preceding clock on a previous data unit received from node 120 resulted in a match. A successful match is indicated by changing the value of NP-MATCH 242 through pulsing activity. NP-DATA 243 is a direction-alternating data bus for carrying input and output data between node 120 and ASIC 110. NP-DIRECT 244 determines the direction of direction-alternating data bus NP-DATA 243 on a particular clock. The direction is determined by changing the value of NP-DIRECT 244 through pulsing activity. Specifically, whether bus NP-DATA 243 is driven by ASIC 110 or node 120 is determined by whether NP-DIRECT is high or low. The value of NP-DIRECT 244 is preferably controlled by circuitry external to ASIC 110. Non-priority pins 241–244 may also include additional pins (not shown) sufficient to initiate and support add and delete operations for ASIC 110 using write/delete data transferred over direction-alternating data bus NP-DATA 243.

Priority pins include P-INIT 251, P-MATCH 252, P-DATAIN 253 and P-DATAOUT 254. P-INIT 251 indicates whether on the current clock ASIC 110 will begin to receive data from priority node 130 for a new data unit. A new data unit is preferably indicated by changing the value of P-INIT 251 from its value on the preceding clock. This is accomplished by pulsing P-INIT 251 high or low. P-MATCH 252 indicates whether or not a CAM read operation completed on a preceding clock on a previous data unit received from node 130 resulted in a match. A successful match is preferably indicated by changing the value of P-MATCH 252 through pulsing activity. P-DATAIN 253 is a constant direction data bus for carrying input data from node 130 to ASIC 110. P-DATAOUT 254 is a constant direction data bus for carrying output data from ASIC 110 to node 130.

CAM cell pins include C-COMP 261, C-DATAIN 262, C-MATCH 263 and C-INDEX 264. C-COMP 261 indicates whether on the current clock a data unit will undergo the first stage of a CAM read operation. The first stage is indicated by changing the value of C-COMP 261 from its value on the preceding clock. This may be accomplished by pulsing C-COMP 261 high or low. C-DATAIN 262 is a constant direction data bus for carrying data units from logic cell 210 to CAM cell 220. C-MATCH 263 indicates whether or not a CAM look-up operation completed by CAM cell 220 on a preceding clock resulted in a match. A successful match is preferably indicated by changing the value of C-MATCH 263 through pulsing activity. C-INDEX 264 is a constant direction data bus for carrying from CAM cell 220 to logic cell 210 indices returned from CAM read operations.

RAM pins 271 include R-INDEX 271 and R-PRIORITY 272. R-INDEX 271 is a constant direction data bus for carrying from CAM cell 220 to RAM 230 indices returned on C-INDEX 264. R-PRIORITY 272 carries from RAM 230 to logic cell 210 information associated with such indices returned from RAM 230. CAM ID pin 280 carries from external circuitry to logic cell 220 an identifier of CAM ASIC 110. PRIORITY pin 290 carries from logic cell 210 to external circuitry information returned on R-PRIORITY 272.

Figure 3:
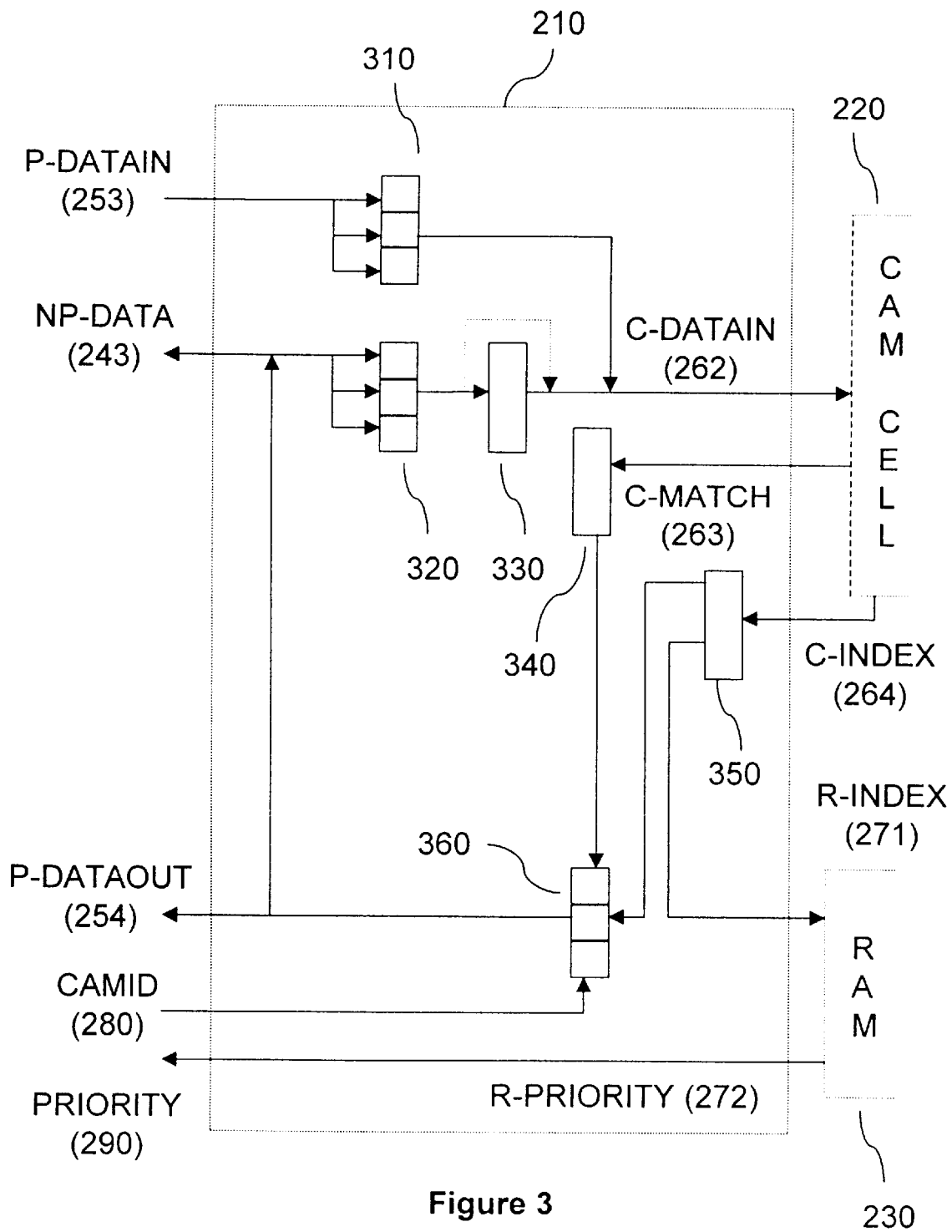
FIG. 3 is a data flow schematic for the control logic cell component of the CAM ASIC according to FIG. 2.

Referring now to FIG. 3, a data flow schematic for logic cell 210 is presented. Pin NP-DATA 243 or P-DATAIN 253 receives input data in successive series of three 16-bit words each. The most significant word in a series is preferably placed on pin NP-DATA 243 or P-DATAIN 253 first, followed by the middle word and the least significant word. The words in a series are assembled into 48-bit data units by one of serial-to-parallel converters 310, 320. The 16-bit words are stored in registers (not shown) until parallelization is performed. The 48-bit data units are preferably media access control (MAC) addresses of a MAC-addressable device operative in the network where ASIC 110 resides. Register 330 is selectively employed to capture data units received from NP-DATA 243 in the event non-priority node 120 and priority node 130 both began to input data for a new data unit on the same clock. Selective implementation of register 330 may be achieved by one of any various known flow control devices. C-DATAIN 262 carries the 48-bit data units from one of converters 310, 320 or register 330, as the case may be, to CAM cell 220, where CAM read operations commence using the 48-bit data units as comparands. Of course, the size, format and contents of data units will change in the CAM cell 220 as successive CAM read operations are performed on the data units.

Pins C-MATCH 263 and C-INDEX 264 receive data resulting from operations conducted in CAM cell 220 on data units. For each data unit, C-MATCH 263 preferably carries a single-bit match bit indicating whether a match was found. C-INDEX 264 preferably carries a 10-bit index. Index is preferably an address of the highest priority location in the CAM array that caused the hit. If no match was found, the 10-bit index returned by CAM cell 220 will be set to a value which will be recognized by the node from which the data unit was received as indicating that no match was found. The match bit and index are fed into registers 340, 350, respectively. The match bit is also forwarded directly to the node associated with the data unit over pin NP-MATCH 242 or P-MATCH 252, as appropriate, to indicate, in advance of receipt of a complete response, whether or not the CAM read resulted in a match. Serial-to-parallel converter 360 combines the match bit and index with a five-bit CAM identifier received from CAMID 280. Pin CAMID 280 receives the CAM identifier from external circuitry. CAM identifier identifies CAM cell 220 in a manner sufficient to distinguish CAM cell 220 from other CAM cells within the network. The CAM identifier, index and match bit are combined into a single 16-bit response word. NP-DATA 243 and P-DATAOUT 254 receive the response word for transmission to the appropriate one of nodes 120, 130. It will be appreciated that the appropriate one of nodes 120, 130 is the node from which the data unit was received. The index is also forwarded from register 350 to RAM 230 on pin R-INDEX 271. RAM 230 is configured to return a single priority bit associated with the particular CAM index. Index priority is preferably assigned as a function of location in the CAM array. The priority bit is returned from RAM 230 to logic cell 210 on R-PRIORITY 272 and is relayed to external circuitry on pin PRIORITY 290.

Figure 4:
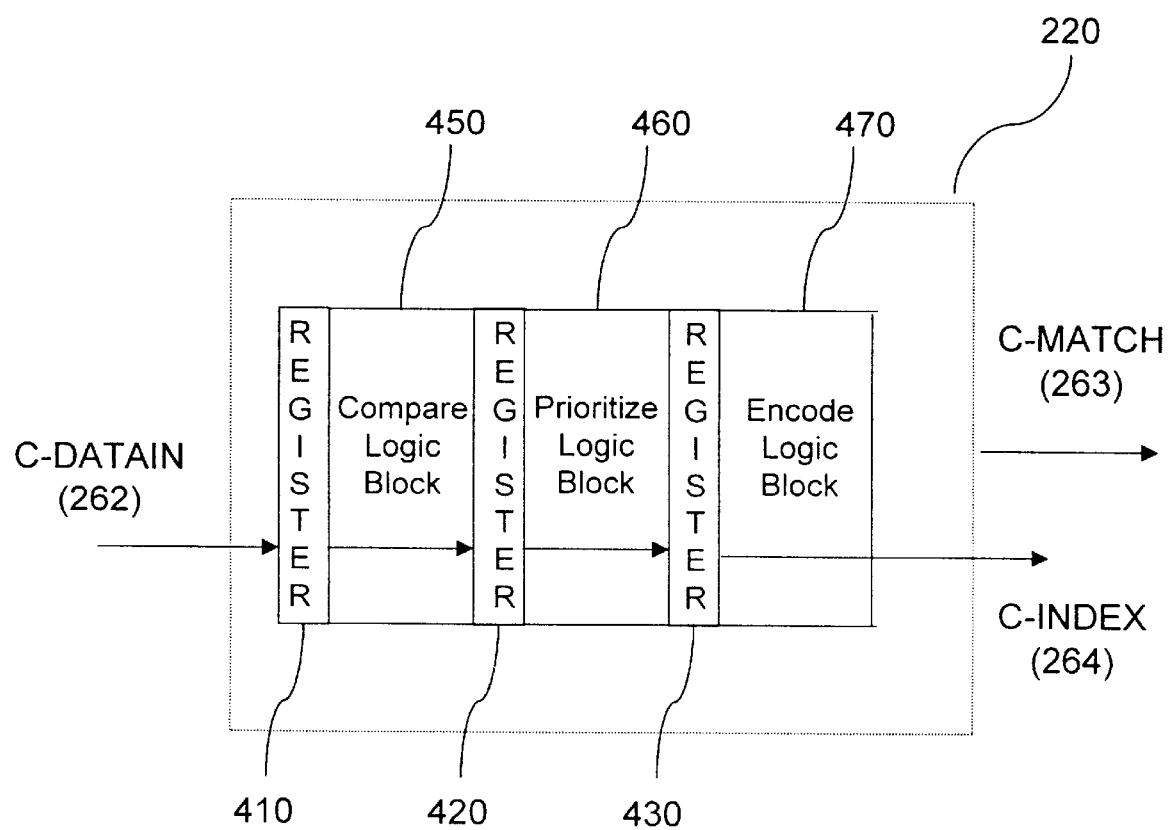
FIG. 4 is a data flow schematic for the CAM cell component of the CAM ASIC according to FIG. 2.

Referring now to FIG. 4, a data flow schematic for CAM cell 220 is presented. Serially-arranged logic blocks include compare logic block 450, prioritize logic block 460 and encode logic block 470. Logic blocks 450, 460, 470 are preferably implemented using application-specific circuitry for performing distinct CAM operations. Compare logic block 450 includes a CAM array containing 48-bit addresses as entries in discrete CAM locations. Addresses are preferably MAC addresses of MAC-addressable devices in the network. Block 450 also includes means for comparing each incoming 48-bit data unit with each 48-bit address entry for matches during a look-up operation. Block 450 further includes means, if matches are found, for returning the indices associated with the data unit. Block 450 further includes means for returning a bit indicating for each location whether a match was found. Prioritize logic block 460 includes means for prioritizing the returned match locations in accordance with a predetermined hierarchy in the event a look-up operation results in multiple matches. Priority is preferably assigned to CAM locations in sequential order beginning with a preselected location. Block 460 also includes means for forwarding the match indicator of the highest priority location and filtering the match indicators of any lower priority locations. Encode logic block 470 includes means for encoding and placing on pin C-INDEX 264 the 10-bit index assigned to the highest priority location.

Logic blocks 450, 460, 470 are operatively segregated by registers 420, 430 interposed between blocks 450, 460, 470. An additional register 410 is preferably interposed in front of block 450. Each data unit arriving on C-DATAIN 262 is captured by register 410 so as to avoid contention with a look-up operation being conducted on the same clock in compare logic block 450 on a prior data unit, if any. Similarly, the match indicators for each location returned from the look-up operation are captured by register 420 so as to avoid contention with a prioritization operation being conducted on the same clock in priority logic block 460 on a prior match indicator, if any. Similarly, the highest priority match indicator returned from a prioritization operation is captured by register 430 so as to avoid contention with an encoding operation involving a prior index being conducted on the same clock in encode logic block 470, if any. Up to three CAM read operations are thereby able to take place simultaneously in CAM cell 220 free from contention, although in the illustrated embodiment only one or two operations will be conducted on any given clock due to input limitations. Captured data units are released from registers 410, 420, 430 to the next operational logic block on the next clock. It will be appreciated that registers 410, 420, 430 might alternatively be interposed behind blocks 450, 460, 470 in the formation of a stage-implemented CAM, or that register 410 might logically be placed outside CAM cell 220. It will also be appreciated that additional stages may be added to provide other desired CAM functionality. A match bit indicating whether or not a match was found for particular data unit preferably becomes valid on pin C-MATCH 263 after the look-up operation is completed.

Figure 5:
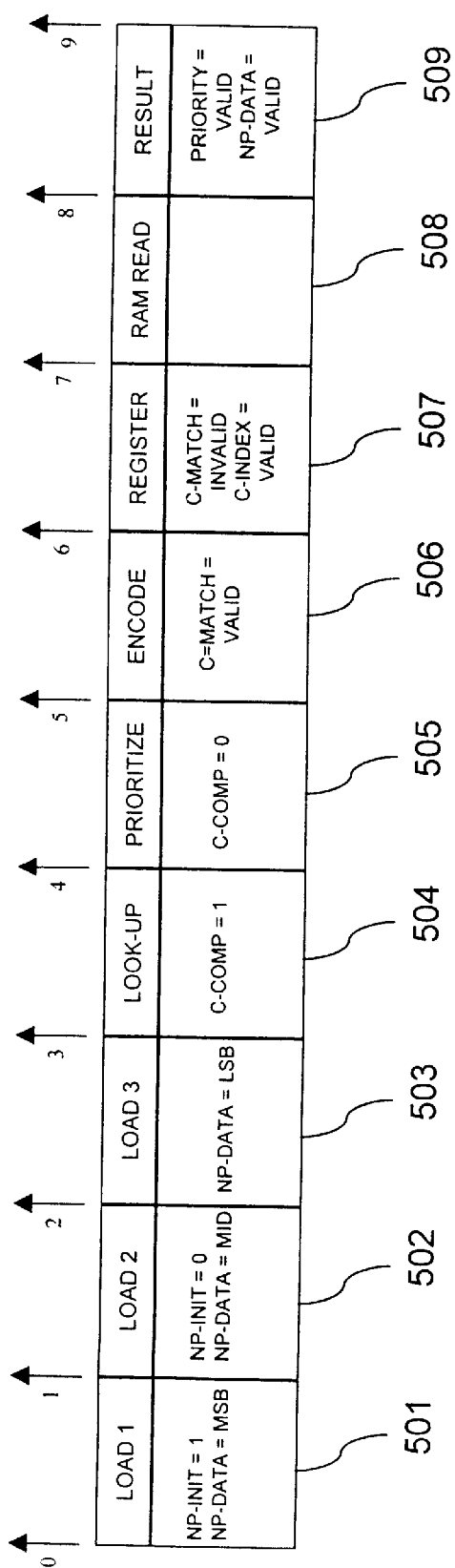
FIG. 5 is an input-output flow timing diagram for the CAM ASIC according to FIG. 2 for a data unit received on the non-priority input bus, where no data unit is received simultaneously on the priority input bus.
Figure 6:
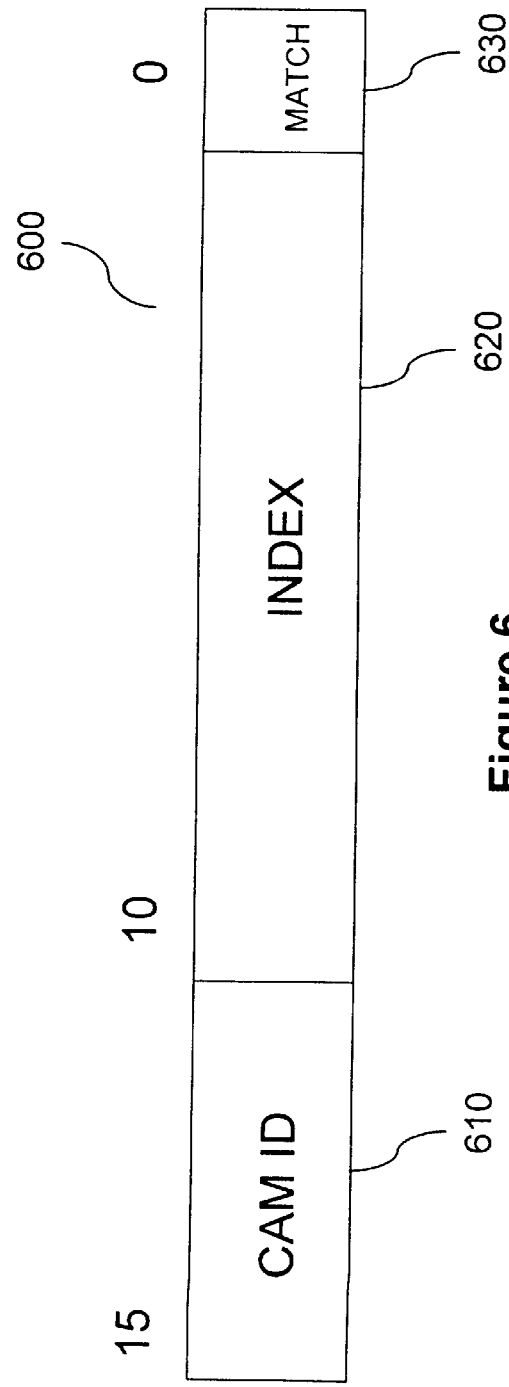
FIG. 6 is the frame format of an CAM response word returned by the CAM ASIC according to FIG. 2.

Turning now to FIG. 5, a timing diagram illustrates a preferred input-output cycle for data received by ASIC 110 from non-priority node 120, where no new data unit from from priority node 130 is started simultaneously. On the edge of clock one (501), pin NP-INIT 241 is pulsed high and the most significant 16-bit word is loaded onto data bus NP-DATA 243. On the edge of clock two (502), the middle word is loaded onto NP-DATA 243 and NP-INIT 241 returns to low. On the edge of clock three (503), the least significant word is loaded onto NP-DATA 243. On the edge of clock four (504), pin C-COMP 261 is pulsed high, indicating that the first CAM cell stage is to proceed on the assembled 48-bit data unit. Preferably, this is the CAM look-up operation conducted in compare logic block 450. On the edge of clock five (505), C-COMP 261 returns to low and the second CAM cell stage is conducted. Preferably, this is the prioritization step performed in prioritize logic block 460. On the edge of clock six (506), pin C-MATCH 263 is pulsed high if the CAM look-up resulted in a hit and the third CAM cell stage is conducted. Preferably, the third stage is the encoding operation done in encode logic block 470 in which the 10-bit index is loaded onto C-INDEX 264. On the edge of clock seven (507), the index returned on C-INDEX 264 is stored in register 350 and C-MATCH 263 returns to low. On the edge of clock eight (508), the index stored in register 350 is sent on pin R-INDEX 271 to RAM 230 for a RAM read. On the edge of clock nine (509), the index stored in register 350 and the match bit are combined in serial-to-parallel converter 360 with the five-bit CAM identifier of ASIC 110 into a 16-bit CAM response word. Referring to FIG. 6, the frame format of the assembled CAM response word 600 returned to node 120 is illustrated. Word 600 has 16 bits, including a five-bit CAM identifier 610, a 10-bit index 620 and a one-bit match bit 630. The assembled word is forwarded on pin NP-DATA 243 to non-priority node 120. Control logic tracks whether the assembled word is to be forwarded on NP-DATA 243 or P-DATAOUT 254. Separately, the priority bit retrieved from RAM 230 during the RAM read operation is forwarded on pin PRIORITY 290 to external circuitry.

Turning now to FIG. 7, a timing diagram illustrates the input-output cycle for data received by ASIC 110 via non-priority node 120, where a new data unit from the priority node 130 is started simultaneously. The cycle proceeds generally as in FIG. 5, except that an additional register step is introduced on the edge of clock four to prevent contention with the new data unit from priority node 130 begun simultaneously. Particularly, on the Is edge of clock four (704), the 48-bits received on clocks one through three remain in register 330 while the CAM read operation begins on the data unit received simultaneously from priority node 130. On the edge of clock five, the 48-bits are released by register 330 and the CAM read operation proceeds on the data unit received from non-priority node as described in FIG. 5, except for the one-clock delay.

Referring to FIG. 8, a timing diagram illustrates a preferred input-output cycle for a data unit received by ASIC 110 from priority node 130. On the edge of clock one (801), pin P-INIT 251 is pulsed high and the most significant 16-bit word is loaded onto data bus P-DATAIN 253. On the edge of clock two (802), the middle word is loaded onto P-DATAIN 253 and P-INIT 251 returns to low. On the edge of clock three (803), the least significant word is loaded onto P-DATAIN 253. On the edge of clock four (804), pin C-COMP 261 is pulsed high, indicating that the first CAM cell stage is to proceed on the assembled 48-bit data unit. Preferably, this is the CAM look-up operation conducted in compare logic block 450. On the edge of clock five (805), C-COMP 261 returns to low and the second CAM cell stage is conducted. Preferably, this is the prioritization step performed in prioritize logic block 460. On the edge of clock six (806), pin C-MATCH 263 is pulsed high if the CAM look-up resulted in a hit and the third CAM cell stage is conducted. Preferably, the third stage is the encoding operation done in encode logic block 470 in which the 10-bit index is loaded onto C-INDEX 264. On the edge of clock seven (807), the index returned on C-INDEX 264 is stored in register 350 and C-MATCH 263 returns to low. On the edge of clock eight (808), the index stored in register 350 is sent on pin R-INDEX 271 to RAM 230 for a RAM read. On the edge of clock nine (509), the match bit and the index stored in register 350 are combined in serial-to-parallel converter 360 with the five-bit CAM identifier of ASIC 110 into a 16-bit CAM response word. Separately, the priority bit retrieved from RAM 230 during the RAM read operation is forwarded on pin PRIORITY 290 to external circuitry.

It will be appreciated by those of ordinary skill in the art that the invention can be embodied in other specific forms without departing from the spirit or essential character hereof. The present description is therefore considered in all respects to be illustrative and not restrictive. The scope of the invention is indicated by the appended claims, and all changes that come within the meaning and range of equivalents thereof are intended to be embraced therein.

We claim:

1. A content-addressable memory cell, comprising:

a series of n interconnected logic blocks, where n is an integer greater than one, each logic block in said series operative for performing a distinct CAM operation;

a memory element operative between each serial pair of said logic blocks for storing data from one of said logic blocks in said pair, wherein multiple CAM operations are concurrently performed on different data;

means for receiving in the first logic block in said series cell input data; and means for transmitting from one or more logic blocks in said series cell output data associated with said cell input data.

2. The content-addressable memory cell according to claim 1, wherein n is greater than two and said distinct CAM operations performed serially include look-up, prioritization and encoding.

3. The content-addressable memory cell according to claim 1, wherein said memory element is a register.

4. The content-addressable memory cell according to claim 1, wherein said logic blocks are hard-wired.

5. The content-addressable memory cell according to claim 1, wherein said cell input data is a media access control address.

6. The content-addressable memory cell according to claim 5, wherein said cell output data includes an index identifying the location of a CAM entry matching said cell input data.

7. The content-addressable memory cell according to claim 1, wherein said cell output data includes an index identifying the location of the highest priority CAM entry matching said cell input data.

8. The content-addressable memory cell according to claim 1, wherein said cell output data includes a match bit transmitted by said transmitting means before said index.

9. A method for simultaneously performing serial CAM operations on a plurality of data units, comprising:

(a) interconnecting a plurality of logic blocks in series;

(b) on a first clock, receiving stage input data in each logic block;

(c) on the first clock, performing a distinct CAM operation on the stage input data to generate stage output data;

(d) on the first clock, storing the stage output data in a memory element operatively separating each logic block from the next logic block in the series, if any; and (e) on a second clock, transmitting the stage output data to the next logic block in said series, if any.

10. The method according to claim 9 wherein the number of logic blocks is three and said distinct CAM operations performed serially include look-up, prioritization and encoding.

11. The method according to claim 9, wherein said memory element is a register.

12. The method according to claim 9, wherein said logic blocks are hard-wired.

13. A method for regulating data flow through a CAM ASIC having multiple input buses, comprising:

(a) receiving cell input data on each of multiple input buses;

(b) prioritizing said cell input data into a sequential order;

(c) transmitting said cell input data to a CAM cell in said sequential order;

(d) performing CAM operations on said cell input data to generate cell output data; and (e) transmitting said cell output data to a node associated with the input bus on which said cell input data was received.

14. The method according to claim 13, wherein said cell input data are assigned priority based on the input bus on which said cell input data were received.

15. The method according to claim 13, wherein said cell output data includes an index, further comprising:

(f) retrieving a priority bit associated with said index; and (g) transmitting said priority bit to external circuitry.

16. The method according to claim 13, wherein said CAM operations include look-up, prioritization; and encoding.

17. The method according to claim 16, wherein said CAM operations are performed serially.

18. The method according to claim 13, wherein said output data includes an index and a match bit, further comprising:

(f) assembling said index and match bit with a CAM identifier into a CAM response word.

19. A content-addressable memory cell, comprising:

a series of interconnected logic blocks, each logic block in said series operative for performing at least one CAM operation;

a memory element operative between each serial pair of said logic blocks for storing data from one of said logic blocks in said serial pair, wherein multiple CAM operations are concurrently performed on different data, means for receiving in the first said logic block in said series input data; and means for transmitting from at least one logic block in said series output data associated with said input data.

20. The content addressable memory cell according to claim 19, wherein said CAM operations include look-up, prioritization and encoding.

* * * * *